United States Patent [19]

Tamura et al.

[11] Patent Number: 4,992,661
[45] Date of Patent: Feb. 12, 1991

[54] METHOD AND APPARATUS FOR NEUTRALIZING AN ACCUMULATED CHARGE ON A SPECIMEN BY MEANS OF A CONDUCTIVE LATTICE DEPOSITED ON THE SPECIMEN

[75] Inventors: Hifumi Tamura, Hachiohji; Yoshinori Ikebe, Katsuta; Katsuhiko Muroyama, Nakaminato; Hiroyuki Sumiya, Ohmiyamachi, all of Japan

[73] Assignees: Hitachi, Ltd., Tokyo; Hitachi Instrument Engineering Co., Ltd., Ibaraki, both of Japan

[21] Appl. No.: 233,016

[22] Filed: Aug. 17, 1988

[30] Foreign Application Priority Data

Aug. 20, 1987 [JP] Japan .............................. 62-207060
Oct. 20, 1987 [JP] Japan .............................. 62-264619

[51] Int. Cl.$^5$ .......................................... G01N 23/225
[52] U.S. Cl. ................................... 250/307; 250/309; 250/310
[58] Field of Search ............... 250/306, 307, 309, 310, 250/492.2, 398

[56] References Cited

U.S. PATENT DOCUMENTS

| | | | |
|---|---|---|---|
| 4,249,077 | 2/1981 | Crawford | 250/306 |
| 4,453,086 | 6/1984 | Grobman | 250/307 |
| 4,645,929 | 2/1987 | Criegern et al. | 250/306 |
| 4,748,325 | 5/1988 | Slodzian | 250/309 |

FOREIGN PATENT DOCUMENTS

1215902 12/1970 United Kingdom ............... 250/440

*Primary Examiner*—Jack I. Berman
*Attorney, Agent, or Firm*—Antonelli, Terry, Stout & Kraus

[57] ABSTRACT

A method of neutralizing an accumulated charge on a surface of a specimen which is examined in a scanning electron microscope (SEM) or a scanning ion microprobe mass analyzer (IMA), utilizes an electrically conductive thin film deposited on a part of the specimen surface. The charge is due to irradiation by a primary charged particle beam from the SEM or IMA. The thin film is made conductivity with a specimen mount mounting the specimen, and the irradiating range of the primary beam covers at least a part of the thin film. Thus, the accumulated charge can be neutralized, thereby a resolution of the SEM being improved due to applying higher accelerating voltage for the primary beam, and measured data of higher reliability being obtained in the IMA.

31 Claims, 6 Drawing Sheets

METHOD AND APPARATUS FOR NEUTRALIZING AN ACCUMULATED CHARGE ON A SPECIMEN BY MEANS OF A CONDUCTIVE LATTICE DEPOSITED ON THE SPECIMEN

BACKGROUND OF THE INVENTION

1. Field of the Invention

This invention relates to a method of neutralizing an accumulated charge on a specimen when such a specimen is used as an object of observation or analysis in a scanning electron microscope or a scanning ion microprobe mass analyzer.

2. Description of the Prior Art

A scanning electron microscope is generally composed of an electron gun, a group of a plurality of lenses, a secondary electron detector, a specimen mount, an amplifier, a contrast adjusting circuit, and a cathode ray tube. Primary electrons emitted from the electron gun is converged by the lens group to be focused on the specimen as a minute beam spot. This focused minute beam spot is scanned over the specimen in synchronism with scanning of an electron beam in the cathode ray tube. On the other hand, secondary electrons generated from the specimen irradiated by the primary electrons are detected by the secondary electron detector to be used as image signals which are applied to and displayed on the cathode ray tube.

In the manner described above, the surface shape, atomic numbers and potential contrast of the specimen can be displayed on the cathode ray tube.

A scanning ion microprobe mass analyzer is generally composed of an ion source, a focusing lens system, a mass spectrometer, a specimen mount, a cathode ray tube and a data processor. A beam of primary ions emitted from the ion source is focused by the lens system to irradiate the surface of the specimen. Secondary ions generated due to emission of specimen atoms from the surface of the specimen irradiated by the primary ion beam are classified in the mass spectrometer according to their mass-to-charge ratio. Thus, identification and quantitative analysis of elements or molecules contained in the specimen can be achieved. A two-dimensional element image of the surface of the specimen can be displayed by scanning the primary ion beam over the specimen in synchronism with the electron beam scanning in the cathode ray tube, separating the secondary ions emitted from various points of the specimen in the mass spectrometer, and using signals representing specific ionic strength as image signals.

When the specimen to be observed or analyzed by the apparatus or methods described above is an insulator material, it is necessary to avoid electrostatic charging of the specimen. Generally, the secondary-emission yield $\eta$ of secondary electrons emitted as a result of irradiation of primary electrons on the surface of the insulator material changes depending on the energy of the incident electrons, and $\eta$ shows a value larger than one (1) in the energy range of 500 eV to several thousand eV. Since no electrostatic charging phenomenon occurs when the value of $\eta$ is larger than one, it has been a common practice to avoid accumulation of the electrostatic charge by restricting the energy of the primary electron beam to a considerably low level.

Such a prior art for prevention of electrostatic charging is intended to avoid undesirable accumulation of electrostatic charge by restricting the energy of the primary electron beam to a low level and leaves no room for adaptation of a higher energy level. As is well known in the art, the resolution of the scanning electron microscope depends upon the diameter of the primary electron beam, and the diameter of the primary electron beam changes depending on the accelerating voltage, that is, the beam energy. Thus, the prior art method used for observation of the insulator specimen has had a problem that an electron beam accelerated by a low accelerating voltage, that is, an electron beam having a low energy level must be used at the sacrifice of the resolution.

In a prior art method used for the scanning ion microprobe mass analyzer or the secondary ion mass spectrometer, irradiation of primary ion beam on the surface of an insulator specimen results in accumulation of an electrostatic charge on the surface of the insulator specimen. Therefore, the prior art method has also had such a problem that the secondary ions cannot pass a mass spectrometer due to the presence of the accumulated charge, resulting in reduced reliability of measured data. With a view to solve such a problem, a prior art publication, for example, Japanese Patent No. 996233 discloses a method in which an electron beam for charging preventive purpose is directed toward an insulator specimen in a relation superposed on an irradiating range of the primary ion beam for the purpose of analysis. This prior art charging preventive method is based on an idea that an electrostatic charge accumulated on the surface of the insulator specimen as a result of irradiation by the primary ions can be neutralized by the electron beam directed in superposed relation.

In the case of the prior art method described above, however, the condition for irradiation by the primary ion beam changes necessarily as the analysis of the insulator specimen proceeds. This variation of the condition for irradiation by the primary electron beam results in a corresponding change in the quantity of the electrostatic charge accumulated on the surface of the insulator specimen, and such a change in the quantity of the accumulating charge results also in a variation of the condition for irradiation by the electron beam used for the charging preventive purpose. Therefore, it has been difficult to optimize the condition for electron beam irradiation, for each of individual insulator specimens, and it has thus been difficult to sufficiently neutralize the electrostatic charge accumulated on the surface of the insulator specimen. Because of the difficulties described above, the prior art charging preventive method has had such a problem that the analyzed data tend to fluctuate, resulting in reduced reliability of the data.

SUMMARY OF THE INVENTION

It is an object of the present invention to provide a method of neutralizing an accumulated charge on a specimen of poor conductive material such as insulator or semiconductor during examination, that is, observation or analysis of the specimen so as to be capable of improving the resolution of the scanning electron microscope and the reliability of measured data of the scanning ion microprobe mass analyzer.

Basically, the present invention which attains the above object utilizes an electrically conductive layer induced below the surface of the insulator specimen by ionized atoms and electrons produced as a result of irradiation of an electron or ion beam, that is, a charged particle beam on the specimen surface. Also, according to the present invention, an electrically conductive thin film is deposited on a part of the surface of the specimen for removing the charge on the surface of the specimen, thereby avoiding accumulation of the charge. More precisely, the charge in the electrically conductive layer produced by irradiation of the primary charged particle beam used for observation or analysis of the specimen are removed through a path provided by the electrically conductive thin film which is previously deposited on a part of the surface of the specimen, thereby eliminating undesirable charge over the specimen.

In accordance with the present invention, there is provided a method of neutralizing the accumulated charge on the surface of the specimen to be examined by detecting secondary charged particles which are emitted from the insulator specimen irradiated by the primary charged particle beam, the method comprising depositing the electrically conductive thin film on the specimen surface except at least a region to be examined, thereby the thin film being made conductive with a specimen mount mounting the specimen, and irradiating the primary charged particle beam over the region so that the irradiating range of the primary charged particle beam covers at least a part of the electrically conductive thin film.

In accordance with a further aspect of the present invention, there is provided a method of neutralizing the accumulated charge on the surface of the specimen to be analyzed by detecting secondary ions which are emitted from the specimen irradiated by the primary ion beam and the electron beam, the method comprising depositing the electrically conductive thin film on the specimen surface except at least a region to be analyzed, thereby said thin film being made conductivity with a specimen mount mounting said specimen, and irradiating the electron beam over the region so that an irradiating range of the electron beam covers at least a part of the electrically conductive thin film.

Thus, the method of neutralizing according to the present invention is featured by utilization of two means, that is, a first means of forming the electrically conductive layer below the surface of the specimen by scanning the primary charged particle beam over the specimen surface and a second means of forming a charge flow-out path on the specimen surface for removing the accumulated charge due to the irradiation by the primary charged particle beam.

Since the accumulated charge on the specimen surface is removed through the charge flow-out path, a higher accelerating voltage can be applied for the primary charged particle beam, thereby improving the resolution of the scanning electron microscope and also obtaining the measured data of higher reliability in the scanning ion microprobe mass analyzer.

The above and other objects, features and advantages will become more readily apparent from the following description, reference being made to the accompanying drawing.

DETAILED DESCRIPTION OF THE INVENTION

Figure 1:
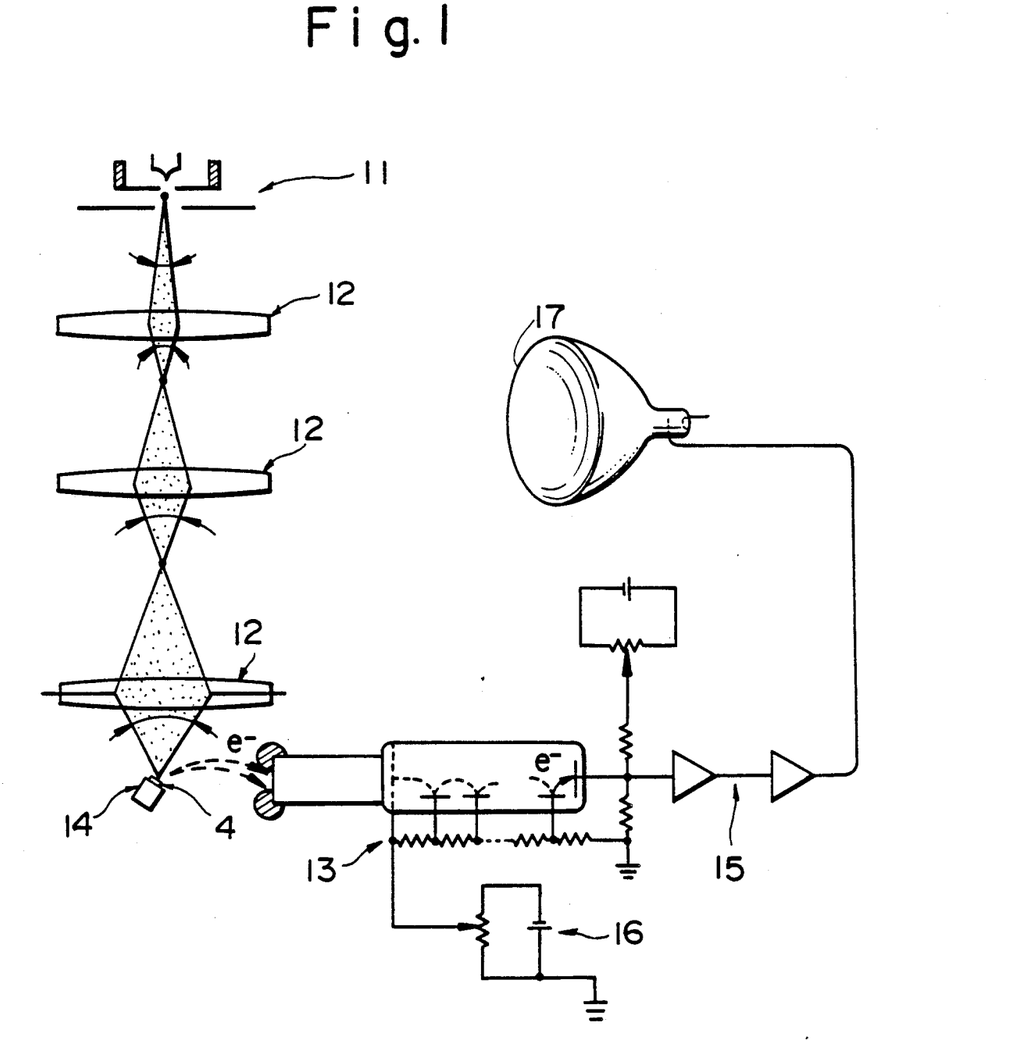
FIG. 1 is a diagrammatic view illustrating the structure of a scanning electron microscope.

As shown in FIG. 1, a scanning electron microscope is generally composed of an electron gun 11, a group of lenses 12, a secondary electron detector 13, a specimen mount 14 mounting a specimen 4, an amplifier 15, a contrast adjusting circuit 16, and a cathode ray tube 17.

In the scanning electron microscope having such a structure, primary electrons emitted from the electron gun 11 is converged by the lens group 12 to be focused on the specimen 4 as a minute beam spot. This focused minute beam spot is scanned over the specimen 4 in synchronism with emission of an electron beam in the cathode ray tube 17. On the other hand, secondary electrons generated from the specimen 4 irradiated by the primary electrons are detected by the secondary electron detector 13 to be used as image signals which are applied to and displayed on the cathode ray tube 17.

In the manner described above, the surface shape, atomic numbers and potential contrast of the specimen 4 can be displayed on the cathode ray tube 17.

Figure 2:
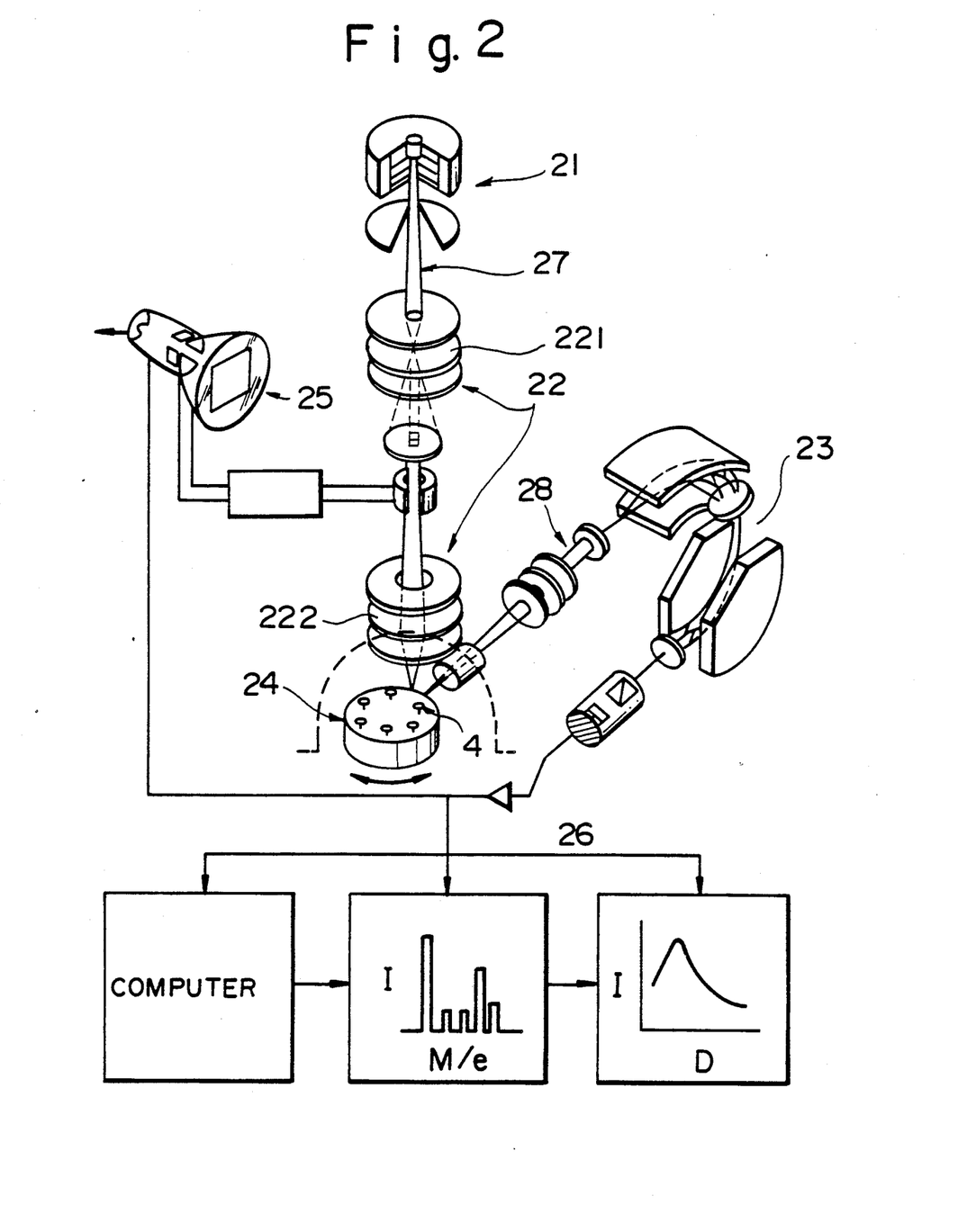
FIG. 2 is a diagrammatic view illustrating the principle of a scanning ion microprobe mass analyzer.

FIG. 2 illustrates the principle of a scanning ion microprobe mass analyzer. As shown in FIG. 2, the scanning ion microprobe mass analyzer is generally composed of an ion source 21, a focusing lens system 22, a mass spectrometer 23, a specimen mount 24 mounting a specimen 4, a cathode ray tube 25, and a data processor 26. The focusing lens system 22 is composed of condenser lenses 221 and objective lenses 222.

In the scanning ion microprobe mass analyzer having such a structure, a beam of primary ions 27 emitted from the ion source 21 is focused by the lens system 22 to irradiate the surface of the specimen 4. Secondary ions 28 generated due to emission of specimen atoms from the surface of the specimen 4 irradiated by the primary ion beam are classified in the mass spectrometer 23 according to their mass-to-charge ratio (M/e). Thus, identification, quantitative analysis and concentration analysis in depthwise direction of elements or molecules contained in the specimen 4 can be achieved. A two-dimensional element image of the surface of the specimen 4 can be displayed by scanning the primary electron beam 27 in synchronism with the electron beam scanning in the cathode ray tube 25, separating the secondary ions 28 emitted from various points of the specimen 4 in the mass spectrometer 23, and using signals representing specific ionic strength as image signals.

When the specimen 4 to be observed by these apparatus is an insulator material, the energy of the primary charged particle beam has hitherto been restricted to a low level to avoid electrostatic charging of the specimen as described hereinbefore.

The neutralizing method according to the present invention which eliminates such a restriction is featured by utilization of two means, that is, a first means of forming an electrically conductive layer below the surface of the specimen by scanning a primary charged particle beam over the specimen surface and a second means of forming a charge flow-out path on the specimen surface for removing the charge due to the irradiation by the primary charged particles beam.

The electrically conductive layer is formed below the surface of the specimen according to the following principle. When an insulator specimen is irradiated by the beam of charged particles having a high energy level, atoms constituting the insulator specimen are ionized to produce ionized atoms and free electrons. As a result, an electrically conductive layer is formed below the surface of the insulator specimen. Formation of such the layer is known as a phenomenon called charged particle- or electron-bombardment induced conductivity (EBIC). Suppose that Jp denotes the density (A/cm$^2$) of the primary charged particles, q denotes the charge, Rp denotes the range of the primary charged particles, Ei denotes the ionization voltage of the atoms constituting the specimen, and Ep denotes the energy of the primary charged particles. Then, the number $\Delta n$ of induced electrons and the number $\Delta p$ of induced ionized atoms are approximately given by the following equation (1):

$$\Delta n = \Delta p \approx \frac{Jp}{q \cdot Rp} \cdot \frac{Ep}{Ei} \quad (1)$$

It will be seen from the above equation (1) that the number of induced ionized atoms $\Delta p$ or the number of induced electrons $\Delta n$ corresponds to the concentration of carriers in the insulator specimen (corresponding to the number of impurity atoms in a semiconductor), and the conductivity increases with the increase in the value of $\Delta n$ or $\Delta p$, and that an electrically conductive layer having a resistance value dependent upon the number $\Delta n$ of the charged particles induced in the specimen is formed on the irradiated surface of the specimen.

On the other hand, the residual energy of the electron beam transmitted through the electrically conductive thin film deposited on the surface of the insulator specimen acts to produce ionized atoms and electrons below the surface of the insulator specimen adjacent to the deposited electrically conductive thin film, so that the electrically conductive layer formed below the analyzed region makes electrical contact with the electrically conductive thin film to form a charge flow-out path through which an accumulated charge can be smoothly discharged. Thus, the accumulated charge on the surface of the insulator specimen as a result of irradiation by the primary electron beam can be removed from the surface of the insulator specimen through the charge flow-out path.

The charge flow-out path is more effectively formed on the surface of the specimen by previously depositing an electrically conductive thin film which is grounded at a portion thereof.

In this case, it is an important requirement that the electrically conductive layer makes sufficient electrical contact with the electrically conductive thin film. For this purpose, a primary charged particle beam used for scanning in, for example, a scanning electron microscope must be scanned to cover at least part of the electrically conductive thin film previously deposited on the surface of the specimen, and the thickness of the electrically conductive thin film must be set at a value which permits transmission of the incident primary charged particles and which can hold the quantity of energy required for inducing the charge.

Figure 3:
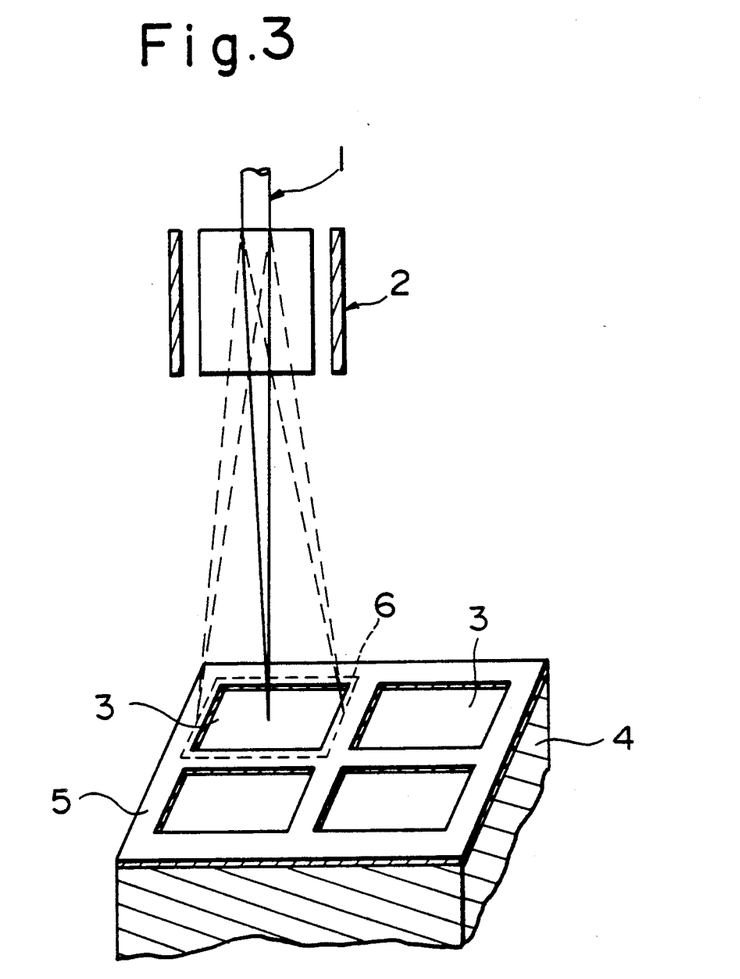
FIG. 3 is a diagrammatic view illustrating an embodiment of the neutralizing method according to the present invention.

FIG. 3 shows an example of application of the method of the present invention when utilized for observation of a insulator specimen using a scanning electron microscope. In FIG. 3, the reference numeral 1 denotes a primary charged particle beam, 2 denotes a deflection electrode assembly for deflecting the primary charged particle beam 1, and 4 denotes an insulator specimen. An electrically conductive thin film 5 of, for example, gold or aluminum is previously deposited on the surface of the specimen 4. The electrically conductive thin film 5 is deposited in, for example, a latticelike pattern as shown so as to expose a plurality of bare regions 3 of the specimen 4 to be observed or analyzed.

The electrically conductive thin film 5 is grounded. Actually, for example, a holder (not shown) of a metal material holding the specimen 4 makes contact with the electrically conductive thin film 5 and is grounded in itself.

In the case of observation of the insulator specimen 4, the surface of the specimen is previously coated with the electrically conductive thin film 5 using a well-known vacuum vapor deposition process, and then, using a mask member placed on the specimen surface, the regions 3 of the specimen 4 to be observed are exposed and the electrically conductive thin film 5 thereon is remained in a lattice-like pattern as shown. Then, the specimen 4 is placed on the specimen mount with the holder of the scanning electron microscope, and the electrically conductive thin film 5 is grounded. Then, the electron beam is deflected from the center of one of the exposed regions 3 of the specimen 4 to scan over a range 6 which covers the adjoining marginal portion of the electrically conductive thin film 5 thereby forming the microscopic image of the observed region 3.

Referring now to Table 1, when specimens including inorganic electrical insulators whose representative is sintered aluminum oxide ($Al_2O_3$), polymer films such as polyvinyl chloride or Mylar (DuPont's trade name), and bio-materials were observed by the scanning electron microscope under the conditions shown in Table 1, stable microscopic images free from any charging phenomenon could be obtained for each of the specimen.

TABLE 1

| Specimen | Aluminum oxide, Boron nitride, Polymer film, Bio-material |
|---|---|
| Electrically conductive thin film | Aluminum, Carbon, Gold, Indium |
| Film thickness (Å) | 100–1,000 |
| Acceleration voltage (kV) | 5–20 |
| Exposed area of specimen (μm square) | 5–300 |
| Electron beam scanning range (μm square) | 10–400 |

In the aforementioned examples of the present invention, the electrically conductive thin film 5 is deposited in a lattice-like pattern to divide the surface of the specimen 4 into a plurality of regions 3 to be observed or analyzed. However, it is apparent that the present invention is in no way limited to such a specific example, and the electrically conductive thin film may be deposited to provide a single region to be observed or analyzed.

An embodiment of the method of neutralizing for a scanning ion microprobe mass analyzer according to the present invention will now be described.

Figure 5:
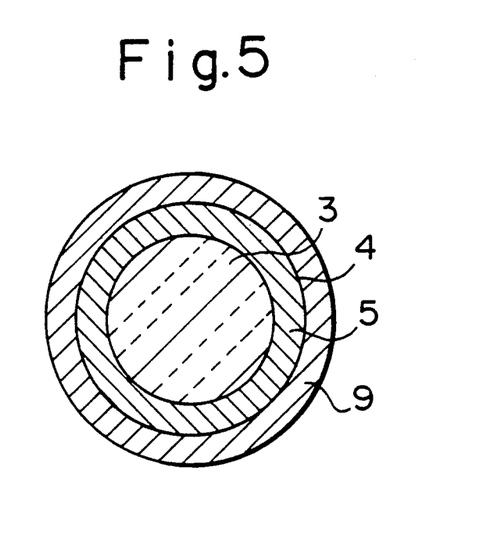
FIG. 5 is a plan view illustrating the insulator specimen shown in FIG. 4.

FIG. 5 is a plan view of an insulator specimen 4 deposited with an electrically conductive thin film 5. Referring to FIG. 5, the electrically conductive thin film 5 is deposited along the marginal edge of a region of the insulator specimen 4 to be analyzed. The electrically conductive thin film 5 is fixed at its marginal edge to a specimen mount (not shown) by a specimen holder 9.

Figure 4:
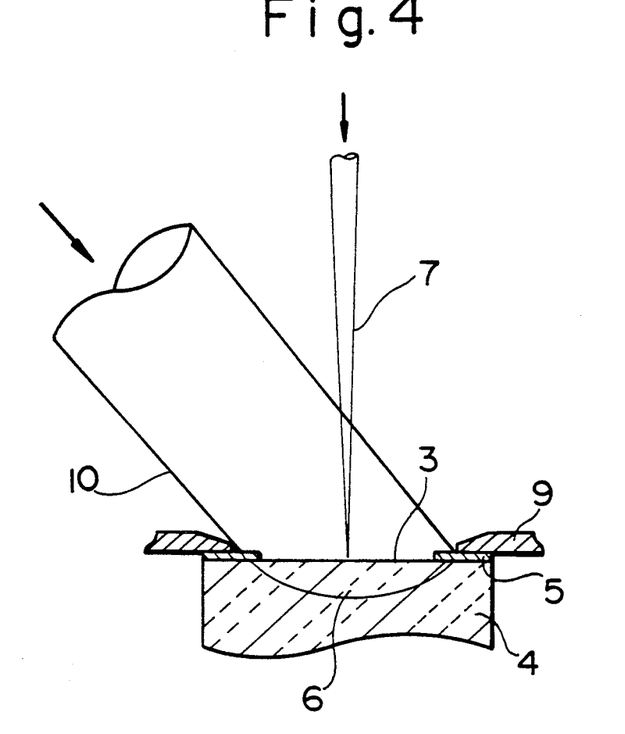
FIG. 4 is a diagrammatically sectional view illustrating the manner of secondary ion mass analysis using an insulator specimen.

FIG. 4 is a diagrammatically sectional view showing the manner of secondary ion mass analysis using such an insulator specimen 4. The electrically conductive thin film 5 makes electrical contact with the specimen holder 9 and is deposited to protrude toward the center of the insulator specimen 4 from the specimen holder 9.

Referring to FIG. 4, a primary ion beam 7 and an electron beam 10 are directed in superposed relation toward the insulator specimen 4. The electron beam 10 irradiates the portion of the electrically conductive thin film 5 protruding from the specimen holder 9, and an electrically conductive layer 6 is induced below the surface of the insulator specimen 4. As a result, a charge flow-out path is formed between the measured region of the insulator specimen 4 and the electrically conductive thin film 5, so that an accumulated charge on the surface of the insulator specimen 4 due to the irradiation by the primary ion beam 7 can be removed from the specimen surface through the electrically conductive thin film 5 and the specimen holder 9.

Gold (Au) is most preferably used as a metal material of the electrically conductive thin film 5. However, other metals such as indium (In), copper (Cu), tin (Sn) and platinum (Pt) may also be used. The thicknees of the electrically conductive thin film 5 must be set at a value which permits transmission of the electron beam 10. For example, the film thickness is selected to be abdut 400Å when the energy of the electron beam 10 is 1.5 keV and the material of the film 5 is gold (Au).

The insulator specimen 4 may be any one of ordinary organic and inorganic insulators. Because the electrostatic charge accumulating on the surface Of the insulator specimen 4 as a result of the irradiation by the primary ion beam can be removed, microanalysis of the insulator specimen in the order of ppm or ppb can beachieved as in the case of microanalysis of a conductive metal.

A secondary ion image (a two-dimensional element image) can be observed in the case of ordinary insulators, therefore, observation of a two-dimensional element distribution on the surface of an insulator and observation of a depthwise image (a three-dimensional image) of the insulator can also be achieved.

A mask is placed on the surface of the insulator specimen 4 when the electrically conductive thin film 5 is to be deposited on the specimen surface by vacuum deposition process. When a plurality of insulator specimens 4 each having a thin film 5 of gold (Au) 400Å thick were prepared, and measurement was made on those specimens 4, fluctuations of the measured data could be reduced to about a multiple of one-tenth as compared to that of insulator specimens not having the thin film of gold.

Figure 6:
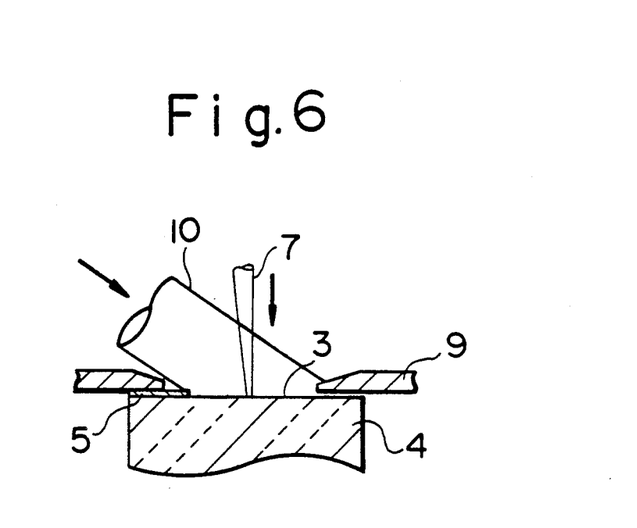
FIG. 6 is a diagrammatically sectional view illustrating the manner of secondary ion mass analysis according to the other embodiment of the present invention.
Figure 7:
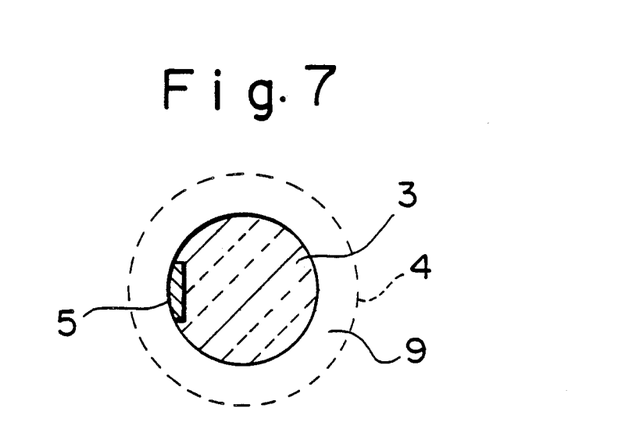
FIG. 7 is a plan view of the embodiment shown in FIG. 6.

FIGS. 6 and 7 are a diagrammatically sectional view and a plan view respectively showing the manner of analysis according to a third embodiment of the present invention. In FIG. 6, the same reference numerals are used to denote similar parts appearing in FIG. 4.

According to this third embodiment, the electrically conductive thin film 5 is deposited on a limited part only of the surface of an insulator specimen 4, because the size of the specimen 4 is small, and deposition of the thin film 5 along the entire marginal edge of the specimen 4 as shown in FIG. 5 is difficult as a matter of fact.

Figure 8:
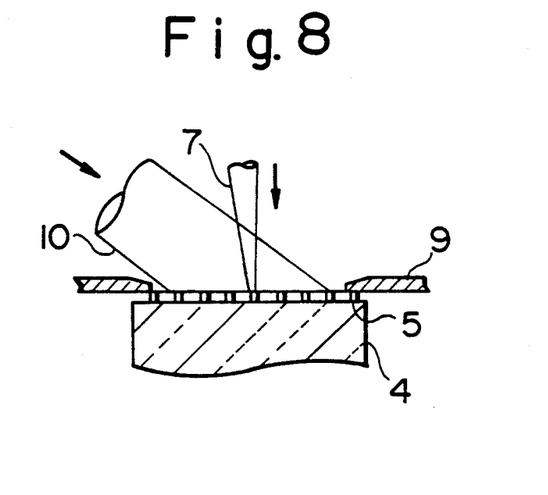
FIG. 8 is a diagrammatically sectional view illustrating the manner of secondary ion mass analysis according to the other embodiment of the present invention.
Figure 9:
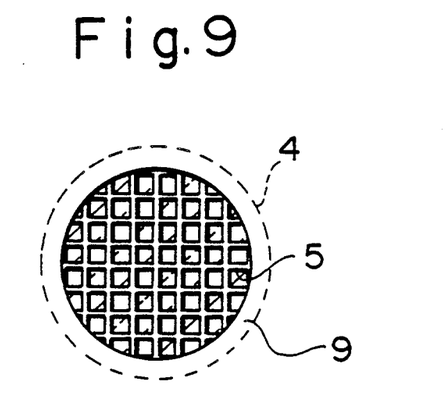
FIG. 9 is a plan view of the embodiment shown in FIG. 8.

FIGS. 8 and 9 are a diagrammatically sectional view and a plan view respectively showing the manner of analysis according to a fourth embodiment of the present invention, and, in FIG. 8, the same reference numerals are used to denote similar parts appearing in FIG. 4.

Referring to FIG. 9, the electrically conductive thin film 5 is deposited in a lattice-like pattern on the surface of an insulator specimen 4 because the size of the specimen 4 is large. This fourth embodiment is advantageous in that, even when the electron beam cannot cover the portion of the electrically conductive thin film 5 deposited along the marginal edge of the specimen 4 due to the large size of the specimen 4, the electron beam 10 can irradiate the portion of the lattice-patterned thin film 5 deposited on the central area of the specimen surface, so that an accumulated charge on the specimen surface can be removed through the lattice-patterned thin film 5. Therefore, even when the size of the insulator specimen 4 is large, the accumulated charge on the specimen surface can be reliably removed.

Application of the method of the present invention to analysis of semiconductors will now be described. Generally, a specimen 4 of a semiconductor such as gallium arsenide or silicon does not make good electrical contact or ohmic contact with the specimen holder 9. Therefore, when the primary ion beam 7 irradiates the semiconductor specimen 4 which is not in good electrical contact with the holder 9, an electrostatic charge accumulating on the surface of the semiconductor specimen 4 has a potential which differs from that of the holder 9 depending on the degree of electrical contact between the specimen 4 and the holder 9. Because of such a potential difference, the energy of secondary ions may be irregularly modulated, and quantitative measurement of the intensity of the secondary ions may not be successfully attained.

In an effort to overcome such a difficulty, a thin film 5 of gold was deposited of the surface of the semiconductor specimen 4 as shown in FIG. 4, and mass analysis was made. As a result of the mass analysis, it was confirmed that quantitative measurement of impurities in gallium arsenide and silicon could be attained with high accuracy. This is caused by the fact that deposition of the thin film 5 of the conductive metal on the surface of the semiconductor specimen 4 ensures good electrical contact between the semiconductor specimen 4 and the specimen holder 9, and the potential of the specimen 4 can be maintained at the same level as that of the specimen holder 9. Thus, the analysis of the intensity of the secondary ions generated from the semiconductor specimen 4 can be successfully attained.

It will be understood from the foregoing description that, according to the method of neutralizing of the present invention, the insulator specimen can be observed or analyzed regardless of the level of an accelerating voltage or energy for the primary charged particle beam, that is, without the necessity for decreasing the level of the accelerating voltage or energy, and the reliability of measured data on the secondary ion mass analysis can be improved.

What is claimed is:

1. A method of neutralizing an accumulated charge on a surface of a specimen to be examined by detecting secondary charged particles which are emitted from said specimen irradiated by a primary charged particle beam said method comprising depositing an electrically conductive film on said specimen surface except at least a region to be examined, the electrically conductive film having a thickness which permits transmission therethrough of the primary charged particle beam, and irradiating said primary charged particle beam over said region so that an irradiating range of said primary charged particle beam covers at least a part of said electrically conductive film, so as to induce an electrically conductive layer in the specimen in contact with the electrically conductive film, the electrically conductive layer and electrically conductive film forming a charge flow-out path, whereby an accumulated charge can be removed from the specimen surface via the charge flow-out path.

2. A method according to claim 1, wherein said specimen is an insulator.

3. A method according to claim 1, wherein said specimen is a semiconductor.

4. A method according to claim 1, wherein the examination of said specimen is concerned with an observation by means of a scanning electron microscope.

5. A method according to claim 1, wherein the examination of said specimen is concerned with an analysis by means of a scanning ion microprobe mass analyzer.

6. A method according to claim 1, wherein said thickness of said electrically conductive film is within a range of 100 Å to 1000Å.

7. A method according to claim 1, wherein said electrically conductive film is grounded.

8. A method according to claim 1, wherein said electrically conductive film is deposited on said specimen using a vacuum vapor deposition process.

9. A method according to claim 1, wherein said electrically conductive film is of any one of aluminum, carbon, gold and indium.

10. A method according to claim 1, wherein said region to be examined is exposed by removing a mask member which covers said region during depositing said electrically conductive film on said specimen surface.

11. A method according to claim 1, wherein the electrically conductive layer is an electron-bombardment induced conductive layer, induced below the surface of the specimen.

12. A method according to claim 11, further comprising a specimen mount mounting said specimen, the specimen mount forming part of the said charge flow-out path.

13. A method according to claim 12, wherein said specimen mount is grounded.

14. A method according to claim 1, wherein the electrically conductive film has a lattice pattern.

15. A method according to claim 1, wherein the electrically conductive film is made of a material selected from the group consisting of aluminum, carbon, gold and indium, and has a thickness of 100–1000Å.

16. A method of neutralizing an accumulated charge on a surface of a specimen to be analyzed by detecting secondary ions which are emitted from said specimen irradiated by a primary ion beam and an electron beam, said method comprising depositing an electrically conductive film on said specimen surface except at least a region to be analyzed, the electrically conductive film having a thickness which permits transmission of said electron beam therethrough, and irradiating said electron beam over said region so that an irradiating range of said electron beam covers at least a part of said electrically conductive film, so as to induce an electrically conductive layer in the specimen in contact with the electrically conductive film, the electrically conductive layer and electrically conductive film forming a charge flow-out path, whereby an accumulated charge can be removed from the specimen surface via the charge flow-out path.

17. A method according to claim 16, wherein said specimen is an insulator.

18. A method according to claim 16, wherein said specimen is a semiconductor.

19. A method according to claim 16, wherein said electrically conductive film is deposited on said specimen using a vacuum vapor deposition process.

20. A method according to claim 16, wherein said electrically conductive film is of any one of gold, indium, copper, tin and platinum.

21. A method according to claim 16, wherein said region to be analyzed is exposed by removing a mask member which covers said region during depositing said electrically conductive film on said specimen surface.

22. A method according to claim 16, wherein the electrically conductive layer is an electron-bombardment induced conductive layer, induced below the surface of the specimen.

23. A method according to claim 22, further comprising a specimen mount mounting said specimen, the specimen mount forming part of said charge flow-out path.

24. A method for the observation of an area of a specimen under the scanning of a beam of charged particles, comprising the steps of:
generating a charged particle beam;
depositing an electrically conductive film on the surface of said specimen excluding the observed area thereof, wherein said electrically conductive film has a thickness which permits transmission therethrough of said charged particle beam;
scanning said charged particle beam over said electrically conductive film and a surface of said specimen, which specimen tends to be electrostatically charged by the scanning of said charged particle beam;
receiving signals representing the characteristic features of said specimen therefrom; and
displaying an image of the characteristic features of said specimen on a visual device in accordance with said signals.

25. A method for the mass analysis of an area of a specimen under the bombardment of a beam of ions, comprising the steps of:
generating a primary ion beam;
bombarding said area of the specimen by said primary ion beam, whereby secondary ions are emitted from said specimen, the specimen tending to be electrostatically charged by the primary ion beam bombardment;
generating an electron beam;
depositing an electrically conductive film on a surface of said specimen excluding the analyzed area thereof, wherein said electrically conductive film has a thickness which permits transmission therethrough of said electron beam; and irradiating said electrically conductive film and the surface of said specimen by said electron beam so that an electrically conductive layer is induced below the surface of said specimen due to electron-bombardment induced conductivity.

26. An apparatus for the analysis of a specimen under the bombardment of a beam of charged particles, comprising:

a charge flow-out path for removing accumulated charge on a surface of the specimen due to the bombardment by the beam of charged particles, the charge flow-out path including an electrically conductive film provided on the surface of the specimen; and also including means for forming an electrically conductive layer below the surface of the specimen, the means for forming an electrically conductive layer including irradiating means for providing a charged particle beam covering said specimen including at least a part of the electrically conductive film, the electrically conductive film having a thickness such that said charged particle beam can be transmitted therethrough.

27. An apparatus for the analysis of an area of a specimen under the bombardment of a beam of primary charged particles, comprising:

means for generating a primary charged particle beam;

means for bombarding said specimen with said primary charged particle beam, wherein said specimen tends to have an accumulated charge on the surface thereof due to the bombardment by said primary charged particle beam;

means for irradiating an electron beam over the surface of said specimen so as to induce an electrically conductive layer below the surface of said specimen due to electron-bombardment induced conductivity; and electrically conductive means on the surface of said specimen excluding the analyzed area thereof, said electrically conductive means being electrically connected with said electrically conductive layer, the electrically conductive means having a thickness such that said electron beam can be transmitted therethrough.

28. An apparatus for the analysis of an area of a specimen under the scanning of a beam of charged particles, comprising:

means for generating a charged particle beam;

means for scanning the surface of said specimen with said charged particle beam, wherein said specimen tends to have an accumulated charge on the surface thereof due to the scanning of said charged particle beam; and an electrically conductive film deposited on the surface of said specimen excluding the analyzed area thereof, said electrically conductive film having a thickness which permits transmission therethrough of said charged particle beam.

29. An apparatus for the analysis of a specimen under the scanning of an electron beam, comprising:

means for generating an electron beam;

means for scanning said electron beam over the surface of said specimen, said specimen tending to have an accumulated charge on the surface thereof due to the scanning of said electron beam;

means for receiving signals representing the characteristic features of said specimen therefrom;

means for displaying an image on a visual device in accordance with said signals; and an electrically conductive film deposited on the surface of said specimen excluding the analyzed area thereof, said electrically conductive film having a thickness which permits transmission therethrough of said electron beam.

30. An apparatus for the analysis of an area of a specimen under the bombardment of a beam of charged particles, comprising:

means for generating an ion beam;

means for bombarding said specimen with said ion beam, wherein said specimen tends to have an accumulated charge on a surface thereof due to the bombardment of said ion beam;

means for generating an electron beam;

means for irradiating said electron beam over an area of the surface of said specimen, wherein said area includes a surface of said specimen bombarded with said ion beam; and an electrically conductive film deposited on the surface of said specimen excluding an analyzed area thereof, wherein said electrically conductive film has a thickness which permits transmission therethrough of said electron beam.

31. An apparatus for the analysis of an area of a specimen under the scanning of a beam of primary charged particles, comprising:

means for generating an ion beam;

means for generating secondary ions from said specimen due to the bombardment of an area of said specimen with said ion beam;

means for mass-analyzing said secondary ions;

means for generating an electron beam;

means for bombarding an area of a surface of said specimen with said electron beam, wherein said area of the surface includes the area bombarded with said ion beam; and an electrically conductive film deposited on the surface of said specimen excluding the analyzed area thereof, wherein said electrically conductive film has a thickness which permits transmission therethrough of said electron beam.

* * * * *